(12) United States Patent
Hariya et al.

(10) Patent No.: US 7,395,190 B2
(45) Date of Patent: Jul. 1, 2008

(54) ANALYTICAL MODEL PRODUCING METHOD AND ANALYTICAL MODEL PRODUCING APPARATUS

(75) Inventors: Masayuki Hariya, Chiyoda (JP); Yoshimitsu Hiro, Yokohama (JP); Yoshiyuki Yamamoto, Yokohama (JP); Hiromitsu Tokisue, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 783 days.

(21) Appl. No.: 10/073,008

(22) Filed: Feb. 12, 2002

(65) Prior Publication Data
US 2003/0078758 A1  Apr. 24, 2003

(30) Foreign Application Priority Data
Oct. 22, 2001  (JP) ............................. 2001-322979

(51) Int. Cl.
   *G06G 7/64*  (2006.01)
(52) U.S. Cl. .............................................. 703/1; 703/7
(58) Field of Classification Search .............. 707/104.1; 703/1, 7
   See application file for complete search history.

(56) References Cited

U.S. PATENT DOCUMENTS

| 5,929,860 A * | 7/1999 | Hoppe ........................ 345/419 |
| 6,611,630 B1 * | 8/2003 | Miller et al. ................. 382/293 |
| 2002/0042697 A1 * | 4/2002 | Yamada et al. .................. 703/2 |
| 2002/0107673 A1 * | 8/2002 | Haller et al. .................... 703/1 |

FOREIGN PATENT DOCUMENTS

JP  2000-155859  6/2000

OTHER PUBLICATIONS

Klaus-Jürgen Bathe, What can go wrong with FEA?, printed Sep. 29, 2005, published 1998 http://www.memagazine.org/backissues.may98/features/wrong/wrong.html, pp. 1-5.*
McWherter et al, "Database Techniques for Archival of Solid Models", ACM, Jun. 2001, pp. 78-87.*
Patent Abstracts of Japan 2000-155859 Jun. 6, 2000.

* cited by examiner

*Primary Examiner*—Paul L Rodriguez
*Assistant Examiner*—Luke Osborne
(74) *Attorney, Agent, or Firm*—Mattingly, Stanger, Malur & Brundidge, P.C.

(57) ABSTRACT

The present invention provides an analytical model preparing apparatus which reduces the user's labor of template selecting operation by selecting and presenting an appropriate template from among a plurality of already prepared templates. The analytical model preparing apparatus of the invention comprises means for entering a shape model to be analyzed; a database which associates at least one already prepared shape model with the analytical model prepared for such an already prepared shape model, and registers the same; means for collating the above-mentioned shape model to be analyzed with at least one already prepared shape model; analytical model preparing means for preparing at least one analytical model corresponding to the shape model to be analyzed, by use of analytical model preparing information prepared for the above-mentioned already prepared shape model, in accordance with the result of collation; and mesh quality evaluating means for calculating a mesh quality evaluation value for the analytical model corresponding to at least one prepared shape model to be analyzed.

4 Claims, 14 Drawing Sheets

| NO. | ANALYTICAL MODEL INFORMATION | SHAPE MODEL | ANALYTICAL MODEL | | |
|---|---|---|---|---|---|
| | | | ANALYTICAL MESH | MESH PREPARING CONDITION | ANALYZING CONDITION |
| 1 | • MODEL NAME: CNKT001<br>• MODEL CLASSIFICATION: CONNECTION ROD<br>• AREA OF ANALYSIS: STRESS ANALYSIS | | | • ELEMENT TYPE: HEXAHEDRON | |
| 2 | • MODEL NAME: COV001<br>• MODEL CLASSIFICATION: SHAFT COVER<br>• AREA OF ANALYSIS: STRESS ANALYSIS | | | • ELEMENT TYPE: HEXAHEDRON | |
| 3 | • MODEL NAME: COV001<br>• MODEL CLASSIFICATION: SHAFT COVER<br>• AREA OF ANALYSIS: VIBRATION ANALYSIS | | | • ELEMENT TYPE: HEXAHEDRON | |
| 4 | • MODEL NAME: CRA001<br>• MODEL CLASSIFICATION: CRANK SHAFT<br>• AREA OF ANALYSIS: STRESS ANALYSIS | | | • ELEMENT TYPE: TETRAHEDRON | |

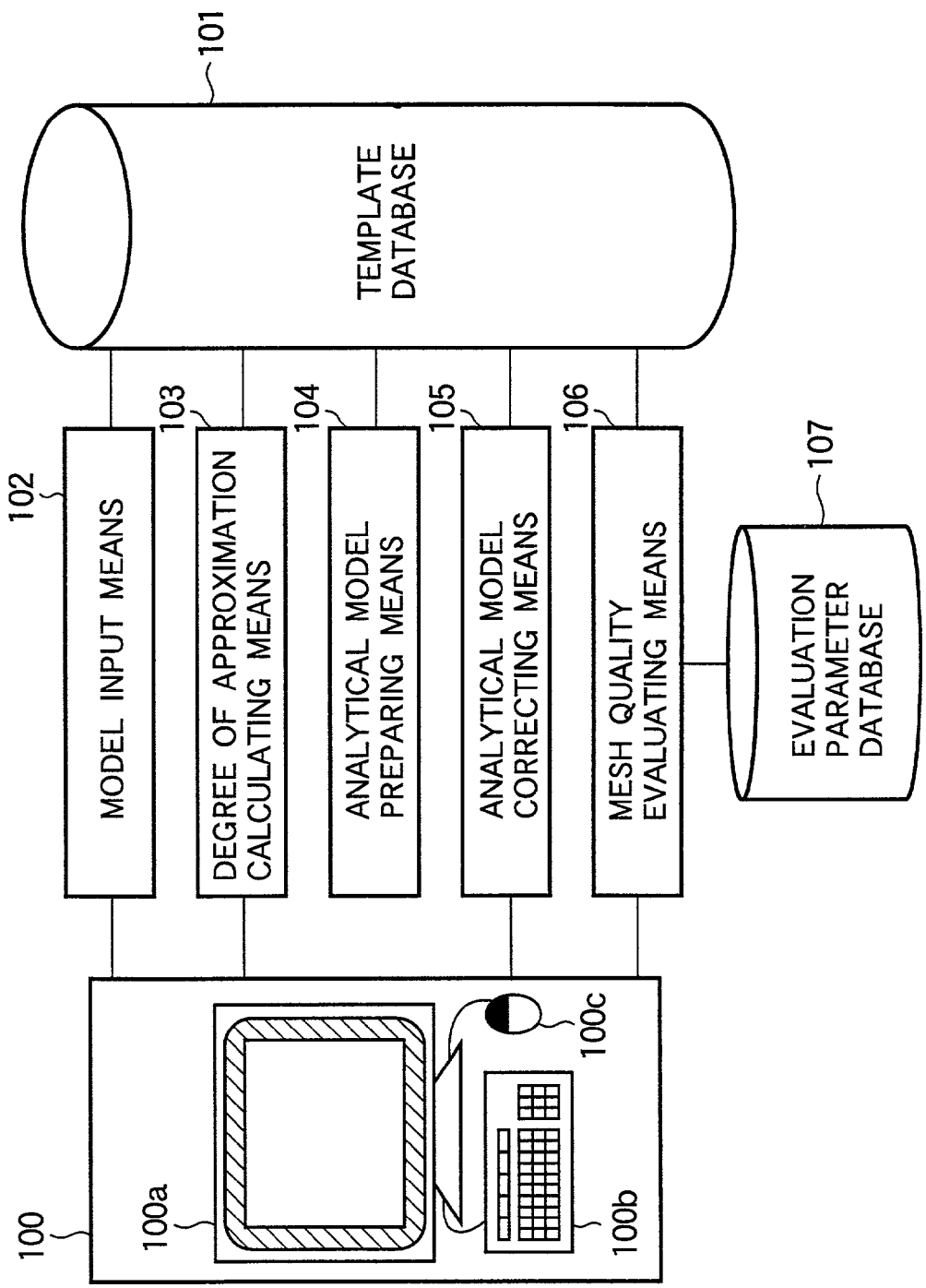

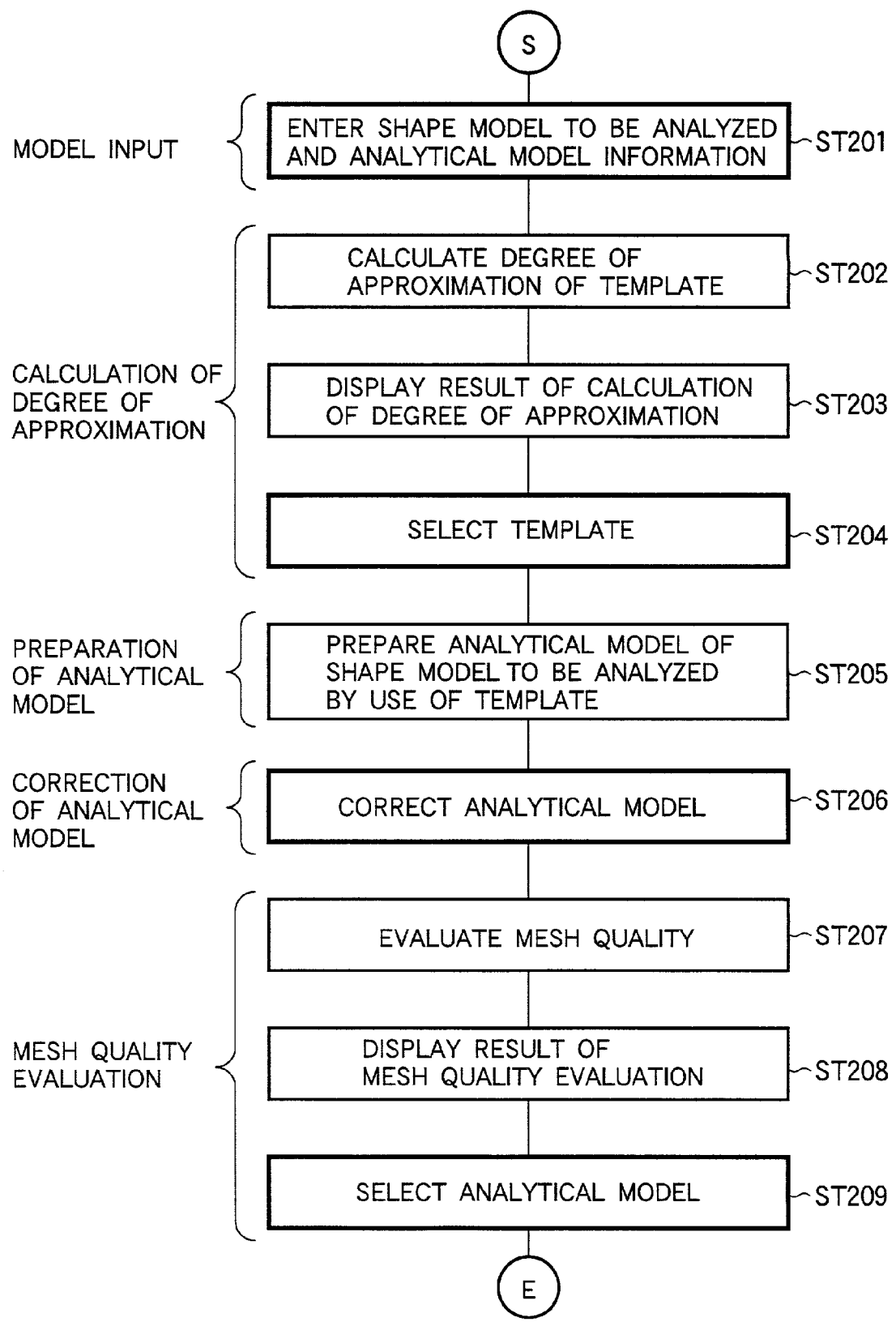

FIG.3

| NO. | ANALYTICAL MODEL INFORMATION | SHAPE MODEL | ANALYTICAL MODEL | | |
|---|---|---|---|---|---|
| | | | ANALYTICAL MESH | MESH PREPARING CONDITION | ANALYTICAL CONDITION |
| 1 | • MODEL NAME<br>• MODEL CLASSIFI-CATION<br>• AREAS OF ANALYSIS | | | • ELEMENT TYPE<br>• ELEMENT SIZE<br>• DENSITY INFOR-MATION<br>• NUMBER OF DIVISIONS<br>• ASSIGNING DIRECTION | • MATERIAL CONDITIONS<br>• LOAD CONDITION<br>• CON-STRAINT CONDITION<br>• GEOMET-RICAL CONDITION |

FIG.4

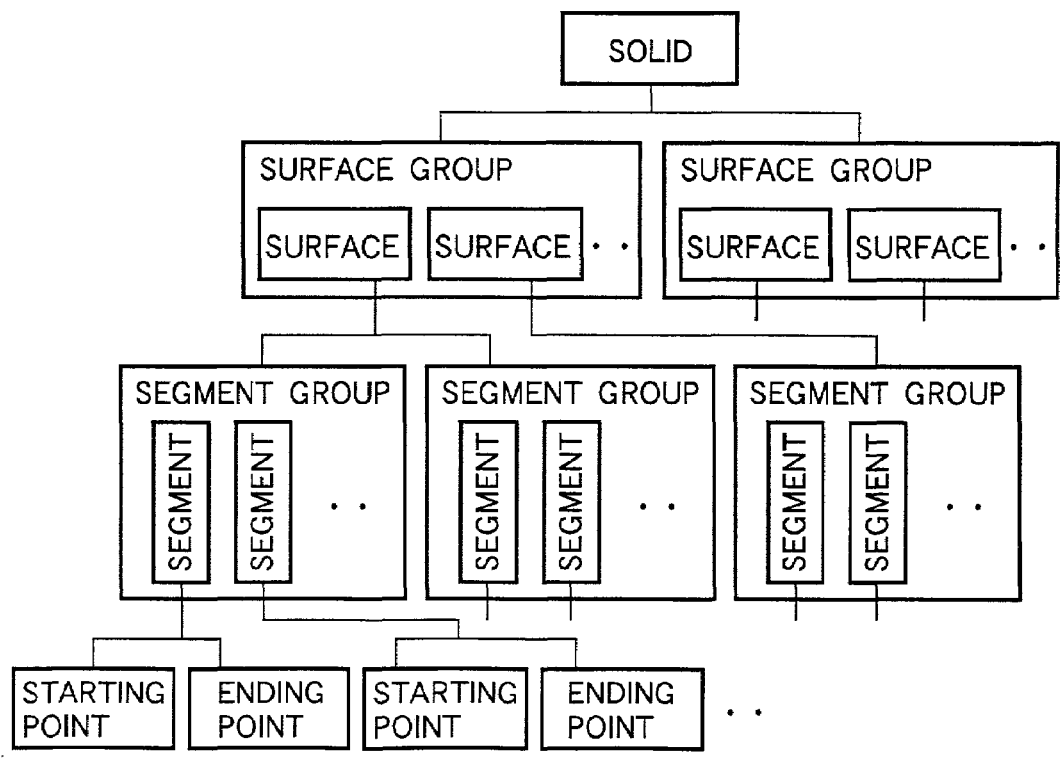

FIG.5

(a) EXAMPLE OF NODAL POINT DATA

| TOTAL NUMBER OF NODAL POINTS | 20 | | |
|---|---|---|---|
| NODAL POINT NO. | X COORDINATE VALUE | Y COORDINATE VALUE | Z COORDINATE VALUE |
| 1 | 0.0 | 0.0 | 0.0 |
| 2 | 5.0 | 0.0 | 0.0 |
| 3 | 0.0 | | |

(b) EXAMPLE OF ELEMENT DATA

| TOTAL NUMBER OF ELEMENTS | 20 | |
|---|---|---|
| ELEMENT NO. | NUMBER OF NODAL POINTS | ELEMENT-COMPOSING NODAL POINT NO. |
| 1 | 8 | 1, 2, 3, 4, 5, 6, 7, 8 |
| 2 | 8 | 2, 9, 10, 3, 6, 11, 12, 7 |
| 3 | 8 | |

FIG.6

| NO. OF SHAPE ELEMENT TO BE ANALYZED | KIND | ELEMENT TYPE | ELEMENT SIZE |
|---|---|---|---|
| 1 | SOLID | HEXAHEDRON | 3.0 |
| 3 | SURFACE | TETRAHEDRON | 2.5 |

(a) EXAMPLE OF DATA STRUCTURE

| SHAPE ELEMENT NO. | KIND | LOCAL ELEMENT SIZE | ELEMENT SIZE CHANGE RATE |
|---|---|---|---|
| 10 | POINT | 0.2 | 1.3 |

(b) EXAMPLE OF GENERATION OF TETRAHEDRON MESHES (NON-UNIFORM DENSITY)

POINT : NO. 10

| RIDGE NO. | NUMBER OF DIVISIONS |
|---|---|
| 1 | 6 |
| 3 | 2 |

FIG.9
| RIDGE NO. | ASSIGNING DIRECTION |
|---|---|
| 1 | +x |
| 3 | −z |
FIG.10
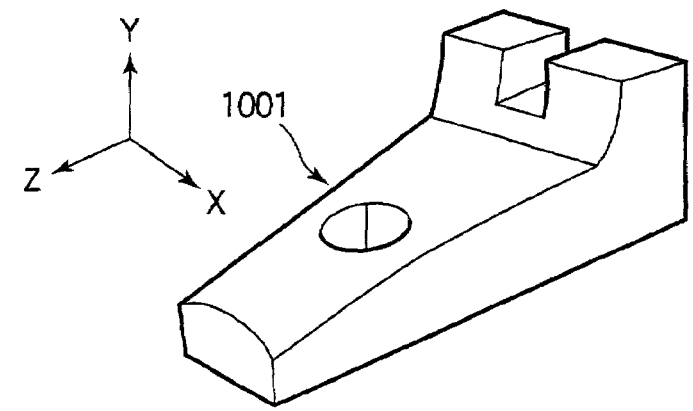
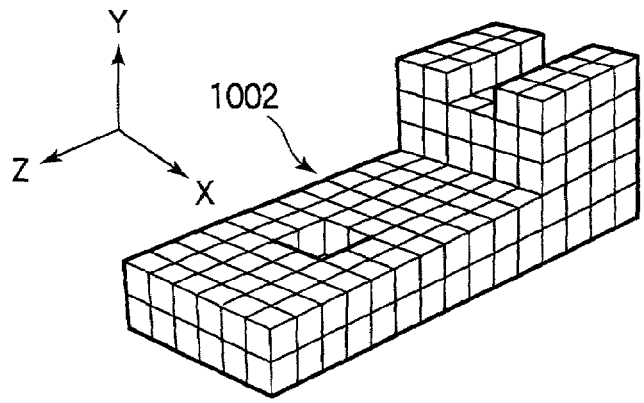
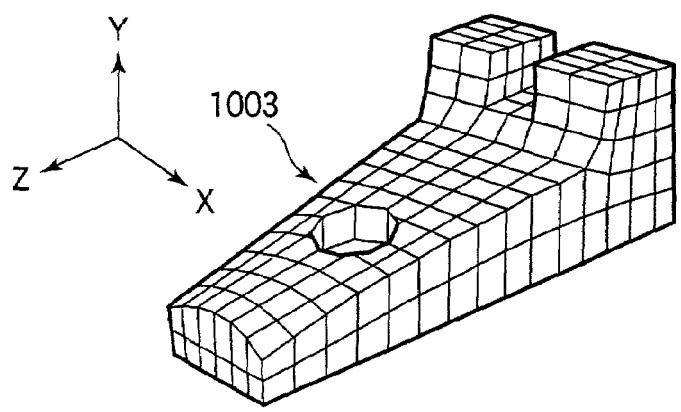

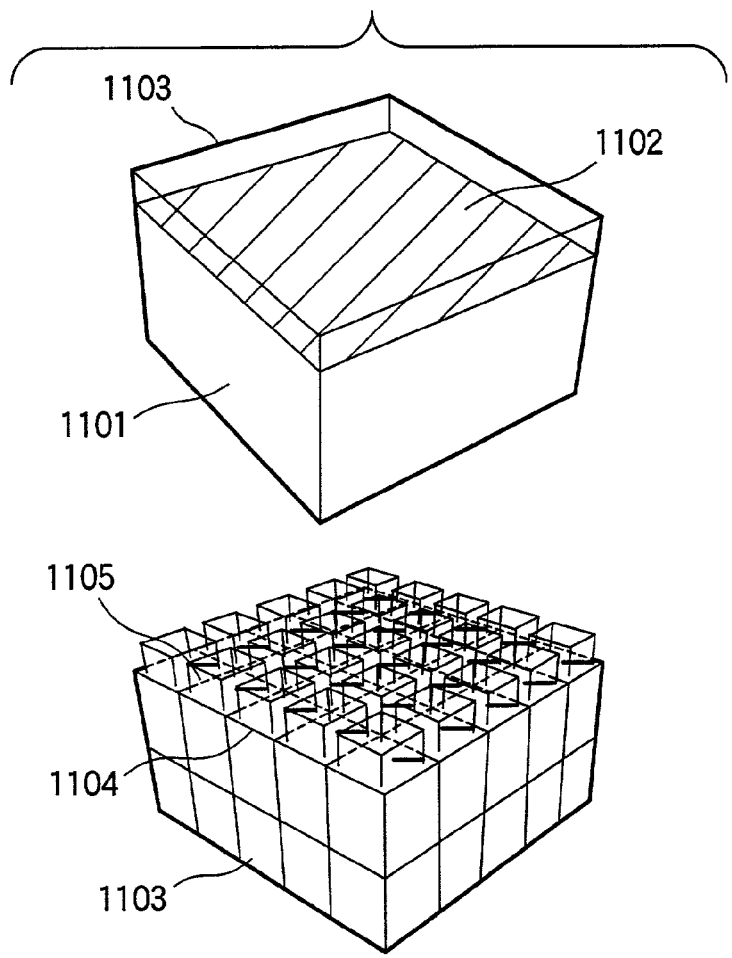

FIG.16

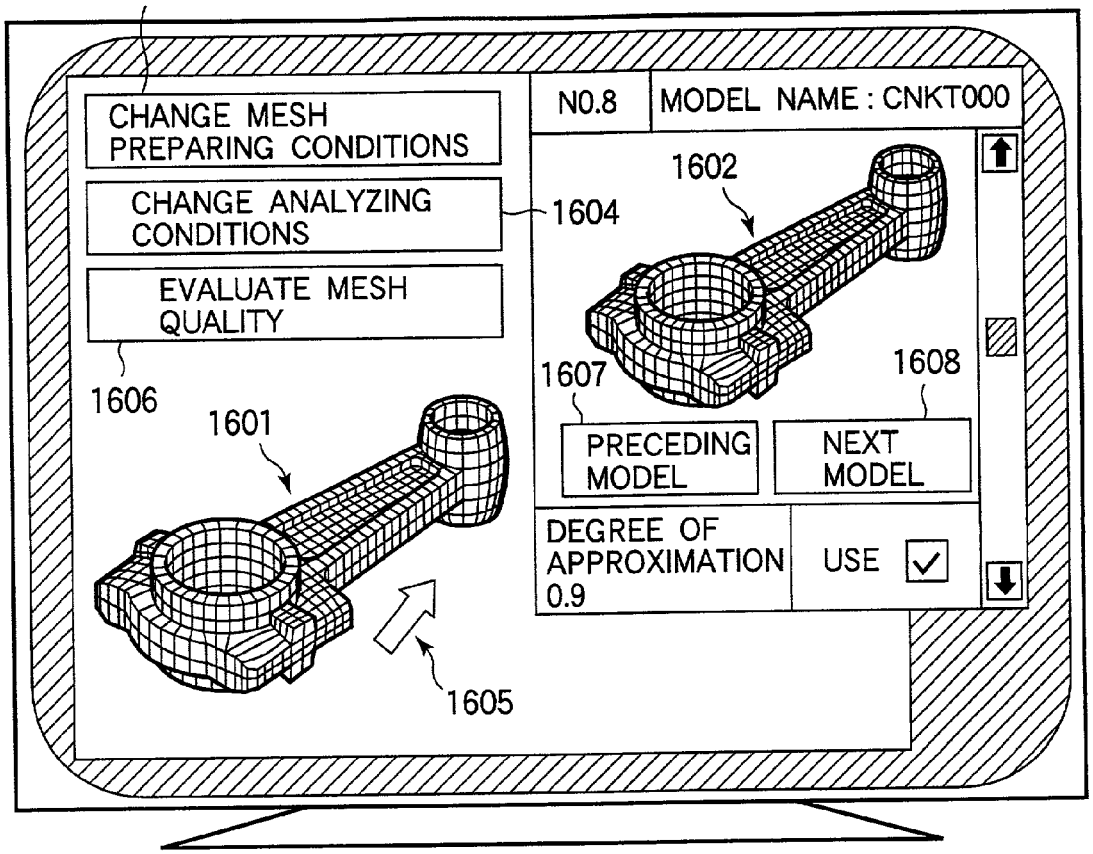

FIG.17

| AREA OF ANALYSIS | MODEL CLASSIFI- CATION | DISTORTION THRESHOLD VALUE | STRETCH THRESHOLD VALUE | ELEMENT EDGE ANGLE THRESHOLD VALUE | ELEMENT SURFACE CAMBER THRESHOLD VALUE |
|---|---|---|---|---|---|
| DEFAULT | DEFAULT | 0.2 | NO_USE | NO_USE | NO_USE |
| STRESS ANALYSIS | CONNECTION ROD | 0.2 | 0.2 | 160.0 | NO_USE |
| VIBRATION ANALYSIS | ENGINE BLOCK | 0.1 | NO_USE | 175.0 | NO_USE |
| STRESS ANALYSIS | DEFAULT | 0.2 | NO_USE | NO_USE | NO_USE |
| STRESS ANALYSIS | SHAFT COVER | 0.3 | NO_USE | 150.0 | NO_USE |

FIG.20

| NO. | ANALYTICAL MODEL INFORMATION | SHAPE MODEL | ANALYTICAL MODEL | | ANALYZING CONDITION |
|---|---|---|---|---|---|
| | | | ANALYTICAL MESH | MESH PREPARING CONDITION | |
| 1 | · MODEL NAME : CNKT001<br>· MODEL CLASSIFICATION : CONNECTION ROD<br>· AREA OF ANALYSIS : STRESS ANALYSIS | | | · ELEMENT TYPE : HEXAHEDRON | |
| 2 | · MODEL NAME : COV001<br>· MODEL CLASSIFICATION : SHAFT COVER<br>· AREA OF ANALYSIS : STRESS ANALYSIS | | | · ELEMENT TYPE : HEXAHEDRON | |
| 3 | · MODEL NAME : COV001<br>· MODEL CLASSIFICATION : SHAFT COVER<br>· AREA OF ANALYSIS : VIBRATION ANALYSIS | | | · ELEMENT TYPE : HEXAHEDRON | |
| 4 | · MODEL NAME : CRA001<br>· MODEL CLASSIFICATION : CRANK SHAFT<br>· AREA OF ANALYSIS : STRESS ANALYSIS | | | · ELEMENT TYPE : TETRAHEDRON | |

ANALYTICAL MODEL PRODUCING METHOD AND ANALYTICAL MODEL PRODUCING APPARATUS

BACKGROUND OF THE INVENTION

1. Field of the Invention

The present invention relates to an analytical model preparing apparatus for preparing an analytical model formed by imposing analytical conditions to meshes for numerical analysis in CAE (Computer Aided Engineering) aimed at rationalizing design work through numerical analysis simulation. In particular, the invention relates to a technique for efficiently preparing an analytical model of a shape model to be analyzed by use of an analytical model having a similar shape as a template.

2. Description of the Related Art

There are available the following conventional methods for generating analytical meshes of a shape model to be analyzed through use of an analytical model having a similar shape as a template.

Japanese Unexamined Patent Application Publication No. 2000-155859 discloses an analytical model preparing apparatus based on a method of interactively specifying a template previously registered by a user in a database, and generating analytical meshes for a shape model to be analyzed. The Publication teaches possibility to efficiently prepare analytical meshes having a quality equivalent to that of analytical meshes registered on a template by using mesh preparing information of the template.

An analytical model preparing apparatus based on the conventional mesh generating technique had however the following problems. In the conventional analytical model preparing apparatus, it is necessary for a user to interactively specify a template. For example, when a plurality of shapes are registered in the database, operation for selecting a proper template requires much time and labor.

Even for identical shape models to be analyzed, the shape of analytical mesh permitting accurate reproduction of a physical phenomenon differs between physical phenomena to be analyzed (i.e., areas of analysis such as stress intensity or vibration characteristics).

It is therefore necessary to select a proper template, taking account of the areas of analysis as well. This selection of template requires sufficient experience in analysis and know-how. The conventional analytical model preparing apparatus was not formed into a system permitting easy use by anyone for efficient preparation of analytical meshes.

SUMMARY OF THE INVENTION

The present invention has an object to provide an analytical model preparing method and an analytical model preparing apparatus using means for saving user's template selecting operation by presenting a proper template from among a plurality of already prepared templates upon preparing an analytical model.

To achieve the aforementioned object, the present invention proposes an analytical model preparing method comprising the steps of entering a shape model to be analyzed; collating the shape model to be analyzed with at least one already prepared shape model stored in a memory unit; and associating the shape model to be analyzed with the already prepared shape model in accordance with the result of the collation, thereby preparing at least one analytical model corresponding to the shape model to be analyzed by use of preparing information of the analytical model registered in the memory unit.

The invention proposes also an analytical model preparing method comprising the steps of entering a shape model to be analyzed; collating the shape model to be analyzed with at least one already prepared shape model stored in a memory unit; associating the shape model to be analyzed with the already prepared shape model in accordance with the result of the collation, thereby preparing at least one analytical model corresponding to the shape model to be analyzed by use of preparing information of the analytical model registered in the memory unit; calculating an evaluation value of the mesh quality of at least one prepared analytical model, and displaying the evaluation value to select an optimum analytical model.

The above-mentioned analytical model preparing method may comprise the steps of entering analytical model information showing information for analytical calculation; and changing the manner of calculation of an evaluation value of mesh quality in accordance with the analytical model information.

The invention provides also an analytical model preparing method comprising the steps of entering a shape model to be analyzed; calculating a degree of approximation between the shape model to be analyzed and at least one already prepared shape model stored in a memory unit; and associating the shape model to be analyzed with the already prepared shape model in accordance with the degree of approximation, thereby preparing at least one analytical model corresponding to the shape model to be analyzed by use of preparing information of the analytical model registered in the memory unit.

The invention provides another analytical model preparing method comprising the steps of entering a shape model to be analyzed; calculating a degree of approximation between the shape model to be analyzed and at least one already prepared shape model stored in a memory unit; associating the shape model to be analyzed with the already prepared shape model in accordance with the degree of approximation, thereby preparing at least one analytical model corresponding to the shape model to be analyzed by use of preparing information of the analytical model registered in the memory unit; and calculating an evaluation value of the mesh quality of at least one prepared analytical model, and displaying the evaluation value to select an optimum analytical model.

The above-mentioned analytical model preparing method may comprise the steps of entering analytical model information showing information for analytical calculation; and changing the manner of calculation of an evaluation value of mesh quality in accordance with the analytical model information.

The invention provides an analytical model preparing apparatus comprising means for entering a shape model to be analyzed; a database which associates at least one already prepared shape model with an analytical model prepared for the already prepared shape model and registers the same; means for collating the shape model to be analyzed with at least one already prepared shape model; and analytical model preparing means which prepares at least one analytical model corresponding to the shape model to be analyzed by use of preparing information of the analytical model prepared for the already prepared shape model in accordance with the result of collation.

The invention provides also an analytic model preparing apparatus comprising means for entering a shape model to be analyzed; a database which associates at least one already prepared shape model with an analytical model prepared for the already prepared shape model and registers the same; means for collating the shape model to be analyzed with at least one already prepared shape model; analytical model preparing means which prepares at least one analytical model corresponding to the shape model to be analyzed by use of preparing information of the analytical model prepared for the already prepared shape model in accordance with the result of collation; and mesh quality evaluating means which calculates an evaluation value of mesh quality of the prepared analytical model corresponding to at least one shape model to be analyzed.

In the above-mentioned analytical model preparing apparatus, there may be provided an input/output unit which causes a user to select an analytical model for utilization by displaying at least one prepared shape model to be analyzed and a mesh quality evaluation value of the analytical model.

The invention provides another analytical model preparing apparatus comprising means for entering a shape model to be analyzed; a database which associates at least one already prepared shape model with an analytical model prepared for the already prepared shape model and registers the same; means for collating the shape model to be analyzed with at least one already prepared shape model; analytical model preparing means which prepares at least one analytical model corresponding to the shape model to be analyzed by use of preparing information of the analytical model prepared for the already prepared shape model in accordance with the result of collation; mesh quality evaluating means which calculates an evaluation value of mesh quality of the prepared analytical model corresponding to at least one shape model to be analyzed; model input means for entering analytical model information showing information of analytical calculation together with the shape model to be analyzed; and means for changing an evaluation value calculating formula of mesh quality in accordance with the entered analytical model information.

In the above-mentioned analytical model preparing apparatus, there may be provided an input/output unit which causes a user to select an analytical model for utilization by displaying at least one prepared shape model to be analyzed and a mesh quality evaluation value of the analytical model.

The invention provides still another analytical model preparing apparatus comprising means for entering a shape model to be analyzed; a database which associates at least one already prepared shape model with an analytical model prepared for the already prepared shape model and registers the same; degree of approximation calculating means for calculating a degree of approximation of the shape model to be analyzed with at least one already prepared shape model; and analytical model preparing means which prepares at least one analytical model corresponding to the shape model to be analyzed by use of preparing information of the analytical model prepared for the already prepared shape model in accordance with the degree of approximation.

The invention provides further another analytical model preparing apparatus comprising means for entering a shape model to be analyzed; a database which associates at least one already prepared shape model with an analytical model prepared for the already prepared shape model and registers the same; degree of approximation calculating means for calculating a degree of approximation of the shape model to be analyzed with at least one already prepared shape model; analytical model preparing means which prepares at least one analytical model corresponding to the shape model to be analyzed by use of preparing information of the analytical model prepared for the already prepared shape model in accordance with the degree of approximation; and mesh quality evaluating means which calculates an evaluation value of mesh quality of the prepared analytical model corresponding to at least one shape model to be analyzed.

In the above-mentioned analytical model preparing apparatus, there may be provided an input/output unit which causes a user to select an analytical model for utilization by displaying at least one prepared shape model to be analyzed and a mesh quality evaluation value of the analytical model.

The invention provides also an analytical model preparing apparatus comprising means for entering a shape model to be analyzed; a database which associates at least one already prepared shape model with an analytical model prepared for the already prepared shape model and registers the same; degree of approximation calculating means for calculating a degree of approximation of the shape model to be analyzed with at least one already prepared shape model; analytical model preparing means which prepares at least one analytical model corresponding to the shape model to be analyzed by use of preparing information of the analytical model prepared for the already prepared shape model in accordance with the degree of approximation; mesh quality evaluating means which calculates an evaluation value of mesh quality of the prepared analytical model corresponding to at least one shape model to be analyzed; model input means for entering analytical model information showing information for analytical calculation together with the shape model to be analyzed; and means for changing an evaluation value calculating formula of mesh quality in accordance with the entered analytical model information.

In the above-mentioned analytical model preparing apparatus, there may be provided an input/output unit which causes a user to select an analytical model for utilization by displaying at least one prepared shape model to be analyzed and a mesh quality evaluation value of the analytical model.

According to the present invention based on steps of entering a shape model to be analyzed, collating the shape model to be analyzed with at least one already prepared shape model stored in a memory unit, preparing at least one analytical model corresponding to the shape model to be analyzed by use of analytical model preparing information registered in association with the already prepared shape model in accordance with the result of collation, selecting a proper template from among a plurality of template registered in a database for the entered shape model to be analyzed, and presenting the thus selected template to a user, it is possible to save labor for template selecting operation.

Because a proper template is provided, it is possible to efficiently prepare meshes capable of being accurately analyzed, and reduce labor of setting analyzing conditions.

BRIEF DESCRIPTION OF THE DRAWINGS

FIG. 1 is a block diagram illustrating a system configuration of an embodiment of the analytical model preparing apparatus of the present invention;

FIG. 2 is a flow-chart illustrating the processing procedure for analytical model preparation by the analytical model preparing apparatus of the invention;

FIG. 3 illustrates the concept of data structure of the template;

FIG. 4 illustrates a typical structure of shape model data based on boundary representation (manner of representation of topological data);

FIG. 5 illustrates typical nodal point and element data from among analytical mesh data;

FIG. 6 illustrates the data structure of element type and element size;

FIG. 9 illustrates a typical data structure of information of the assigning direction;

FIG. 10 is a descriptive view of the hexahedron mesh generating method based on the mapping process;

FIG. 11 illustrates a case of conversion of load conditions;

FIG. 12 illustrates a typical analyzing condition input window displayed by the analytical model registering means 102;

FIG. 16 illustrates a typical output screen of the analytical model correcting means 105;

FIG. 17 illustrates a typical data structure of the evaluation parameter database 107;

FIG. 20 illustrates typical contents of registration of the template database.

DESCRIPTION OF THE PREFERRED EMBODIMENTS

Figures 7, 8:
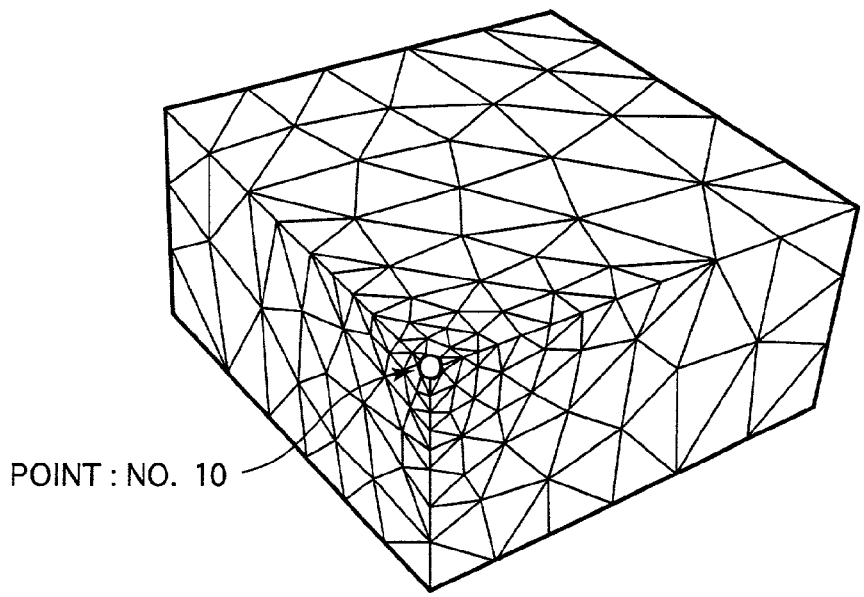
FIG. 7 illustrates a typical data structure of density information and a case where a structural tetrahedron mesh is prepared on the basis of such data.
FIG. 8 illustrates a typical data structure of information of the number of divisions.

Embodiments of the analytical model preparing apparatus of the present invention will now be described with reference to FIGS. 1 to 21. In the following description of the embodiments, the template contains data of analytical model information and a shape model registered in association with data of an analytical model prepared for that shape model. The term the analytical model information means information for specifying the kind of analytical calculation such as model name, model classification and area of analysis. The term the analytical model covers data of an analytical mesh and mesh preparing conditions for preparing such an analytical mesh (kind of mesh, mesh size, mesh pattern and density information) registered in association with the analyzing conditions (material condition, load condition and constraint condition).

1. Outline of Analysis Model Preparing Apparatus of the Invention

FIG. 1 is a block diagram illustrating the system configuration of an embodiment of the analytical mold preparing apparatus of the present invention. The analytical model preparing apparatus of the invention comprises input/output means 100 for performing input and output of a shape model to be analyzed and analytical model information; a template database 101 permitting registration of at least one template; model input means 102 which registers a shape model to be analyzed and analytical model information in the apparatus; degree of approximation calculating means 103 which calculates a degree of approximation between the shape model to be analyzed and the shape model registered on a template, and outputs the result onto a display 100a; analytical model preparing means 104 which prepares an analytical model of the shape model to be analyzed by use of the template; analytical model correcting means 105 which corrects an analytical model; an evaluation parameter database 107 permitting registration of at least one mesh quality evaluation parameter; and mesh evaluating means 106 which evaluates the mesh quality on the basis of mesh evaluation parameters. The input/output means 100 comprises a display 100a, a keyboard 100b and a mouse 100c.

FIG. 2 is a flow-chart illustrating the processing procedure of analytical model preparation by the analytical model preparing apparatus of the invention. In FIG. 2, the processing in a thick-line box represents interactive processing. The name of the processing means executing the processing is shown to the left of the processing.

The analytical model preparing apparatus of this embodiment is based on steps of causing a user to enter a shape model to be analyzed and analytical model information; displaying at least one template permitting efficient generation of a desired analytical model in response to analytical model information; causing the user to select a desired template; preparing an analytical model of the shape model to be analyzed on the basis of preparing conditions or analyzing conditions of the analytical model registered in each of the selected templates; and causing the user to select, thereby preparing the analytical model. It is possible to reduce troublesome labor of selecting a template through the procedure of displaying a candidate template as described above. By taking over the analyzing conditions registered in the template, complicated labor for entering analyzing conditions can be reduced.

2. Operation of Individual Component Means

Operation of the individual component means will now be described in accordance with the analytical model preparing procedure shown in FIG. 2.

2.1 Template Database 101

The template database 101 can register at least one template.

FIG. 3 illustrates the concept of data structure of template. A template contains analytical model information showing information of analytical calculation such as the template number intrinsic in the template database 101, the name of the model to be analyzed, the model classification, and the area of analysis, a shape model to be analyzed, and the analytical model prepared for the shape model, registered in association with each other.

The boundary representation is used in this embodiment as a representation of shape model data. In the boundary representation, shape model data are represented with topological data representing interfaces, and geometrical data representing the shape of the interfaces. Shape elements such as solid, surface, segment and point composing a shape model have a solid number, a surface number, a segment number and a point number as intrinsic identifiers in the shape model.

FIG. 4 illustrates a typical structure (topological data representation) of shape model data by the boundary representation. In the boundary representation structure, a solid has at least one set of contiguous interface numbers belonging thereto. A surface has at least one segment number group belonging thereto. A segment has a starting and an end point numbers thereof. A point has a three-dimensional coordinate value as a geometrical data. There are available various kinds of representing geometrical data of a line or surface, and any of them may be adopted. In this embodiment, the NURBS function popularly used for shape representation in three-dimensional CAD is adopted. The definition functions of a K×L-dimensional surface based on NURBS are expressed by formula (1).

Formula (1):

$$\begin{cases} S_x(u,v) = \dfrac{\sum_{i=0}^{n}\sum_{j=0}^{m} N_{i,K}(u)M_{j,L}(v)w_{ij}P_{xij}}{\sum_{i=0}^{n}\sum_{j=0}^{m} N_{i,K}(u)M_{j,L}(v)w_{ij}} \\[2ex] S_y(u,v) = \dfrac{\sum_{i=0}^{n}\sum_{j=0}^{m} N_{i,K}(u)M_{j,L}(v)w_{ij}P_{yij}}{\sum_{i=0}^{n}\sum_{j=0}^{m} N_{i,K}(u)M_{j,L}(v)w_{ij}} \\[2ex] S_z(u,v) = \dfrac{\sum_{i=0}^{n}\sum_{j=0}^{m} N_{i,K}(u)M_{j,L}(v)w_{ij}P_{zij}}{\sum_{i=0}^{n}\sum_{j=0}^{m} N_{i,K}(u)M_{j,L}(v)w_{ij}} \end{cases}$$

In formula (1), the number of control points is $(n+1)\times(m+1)$; $N_{i,K}(u)$, $M_{j,L}(v)$ are basis functions in the directions of parameters u and v; and $W_{ij}$ is the weight of each control point. The NOT-vector is $[x_0 x_1 \ldots x_p][y_0 y_1 \ldots y_q]$, where $p=n+K+1$ and $q=m+L+1$.

As analytical model data, analytical mesh data and data registered in association with mesh preparing conditions for preparing the analytical mesh and analyzing conditions are registered.

FIG. 5 illustrates typical nodal point data and element data from among analytical mesh data. As analytical mesh data, nodal point data (total number of nodal points and nodal point coordinate value) and element data (total number of elements, number of nodal points composing an element, and nodal point number) are registered as shown in FIG. 5.

As mesh preparing conditions, pieces of information regulating the mesh shape and number of meshes including the type of element such as tetrahedron or hexahedron, the element size representing the size of an element, the density information, the number of divisions, and the assigning direction are registered. The mesh shape and the number of meshes have an important effect on the analyzing accuracy and the analyzing time. In order to prepare an analytical model excellent in calculating efficiency and accuracy, therefore, it is necessary to set proper mesh preparing conditions. The pieces of information regulating the mesh shape are defined as attribute values for the apex, the ridge, the surface and the solid composing the shape model.

FIG. 6 illustrates the data structure of the element type and the element size. The number of shape element, the kind of shape element, the element type and the element size are registered.

FIG. 7 illustrates a typical data structure of density information and preparation of a structural tetrahedron mesh based on such data. FIG. 7(a) illustrates a typical data structure of density information. The number of shape element, the kind of shape element, the local element size, and the change rate of element size are registered in association with each other. For a shape element for which density information has been set, a mesh of a local element size locally specified is generated, and it is thus possible to generate meshes of which the element size has been changed smoothly to the element size of the basic information in accordance with an element size change rate set with this as reference. The user can refine meshes only in a portion important in analysis by interactively setting the density information. It is therefore possible to minimize the increase in the number of meshes, i.e., in the analytical calculation time, and thus to improve locally the analytical accuracy. FIG. 7(b) illustrates typical preparation of tetrahedron meshes on the basis of the density information shown in FIG. 7(a) with an element size of 2.0 as a whole.

FIG. 8 illustrates a typical data structure of the number of divisions information. The number of divisions is registered in association with the segment number. The user can adjust the number and shape of generated meshes by interactively specifying a ridge of a shape model to be analyzed by means of the input/output unit 100 and entering the corresponding number of divisions.

FIG. 9 illustrates a typical data structure of information of the assigning direction. The assigning direction regulates the shape of an intermediate model (mapping model) prepared upon generating hexahedron meshes by the mapping process.

FIG. 10 is a descriptive view of the hexahedron mesh generating method based on the mapping process. A method of generating hexahedron meshes based on the mapping process is disclosed in Japanese Unexamined Patent Application Publication No. 1-311373.

In the mesh generating method based on the mapping process, a mapping model 1002 divided into space lattices is generated after arranging ridges composing a shape model in parallel with the coordinate axis on the basis of geometrical parameters of shape such as the ridge length and the angle between ridges of a shape model, from the entered shape model 1001. Finally, a hexahedron mesh 1003 is generated by mapping the lattice points of the mapping model 1002 onto the shape model 1001 by use of the boundary-fit process. The shape of the mapping model is regulated by the direction of ridge arrangement (assigning direction) and the number of divisions of the ridge. The assigning direction of the ridge determines a pattern of generated meshes, and the number of divisions of ridge determines the mesh density. The user can therefore interactively change an automatically ridge assigning direction or number of divisions of the ridge, and thus control the shape of the generated meshes.

Physical conditions upon executing analytical calculation such as material conditions, load conditions, constraint conditions and geometrical conditions are registered as analyzing conditions. These analyzing conditions are as well defined as attribute values for apex, ridge, surface and solid composing a shape model, and converted into attributes of the mesh on the basis of corresponding relationship between the shape and mesh after preparation of the analytical meshes.

FIG. 11 illustrates a case of conversion of load conditions. A hexahedron mesh 1104 is generated by applying a load 1103 onto the surface 1102 having a surface number 1 represented by a hatched portion in a solid 1101. In the case shown, the load 1103 applied to the surface 1102 is converted so that the load conditions are imparted to an element surface 1105 located on the surface of the surface No. 1 in the hexahedron mesh 1104.

Mesh dividing conditions and analyzing conditions are registered in the template so as to permit preparation of meshes having a proper shape in accordance with the model to be analyzed and the area of analysis. All these conditions are defined as attributes of the shape element composing the shape model. It is therefore possible to efficiently generate a high-quality analytical model similar to the analytical model registered in the template for the shape model to be analyzed, by appropriately associating the shape model to be analyzed with the shape element of the shape model registered in the template, and copying the attributes of the associated shape element of the template to the shape element of the shape model to be analyzed.

2.2 Model Input Means 102

The model input means 102 urges the user to enter pieces of analytical model information such as the shape model to be analyzed, the model name, the model classification and the area of analysis for the purpose of specifying a kind of analytical calculation. In response to this, the user enters the shape model to be analyzed and model information from the input/output unit 100.

FIG. 12 illustrates a typical analyzing condition input window displayed by the analytical model registering means 102. The analyzing condition input window comprises, for example, a shape model name input column 1201 showing the product type, a model classification input column 1202, an analysis area input column 1203, a PREVIEW button 1204 and an EXECUTE button 1205 for starting analytical model preparation in the apparatus of the invention, and a degree of approximation threshold value input column 1206.

When the PREVIEW button 1204 is operated, the processing is temporarily interrupted at the point in time of calculating a degree of approximation of the model, and the model registered in the template and the degree of approximation are displayed on the display 100a. When the EXECUTE button 1205 is operated, analytical models are prepared without interruption for templates having degrees of approximation over the threshold value entered into the degree of approximation threshold value input column 106 after calculation of the degree of approximation to evaluate the mesh quality. Input of the model name, the model classification or the area of analysis may be omitted in units of item.

2.3 Degree of Approximation Calculating Means 103

Figure 13:
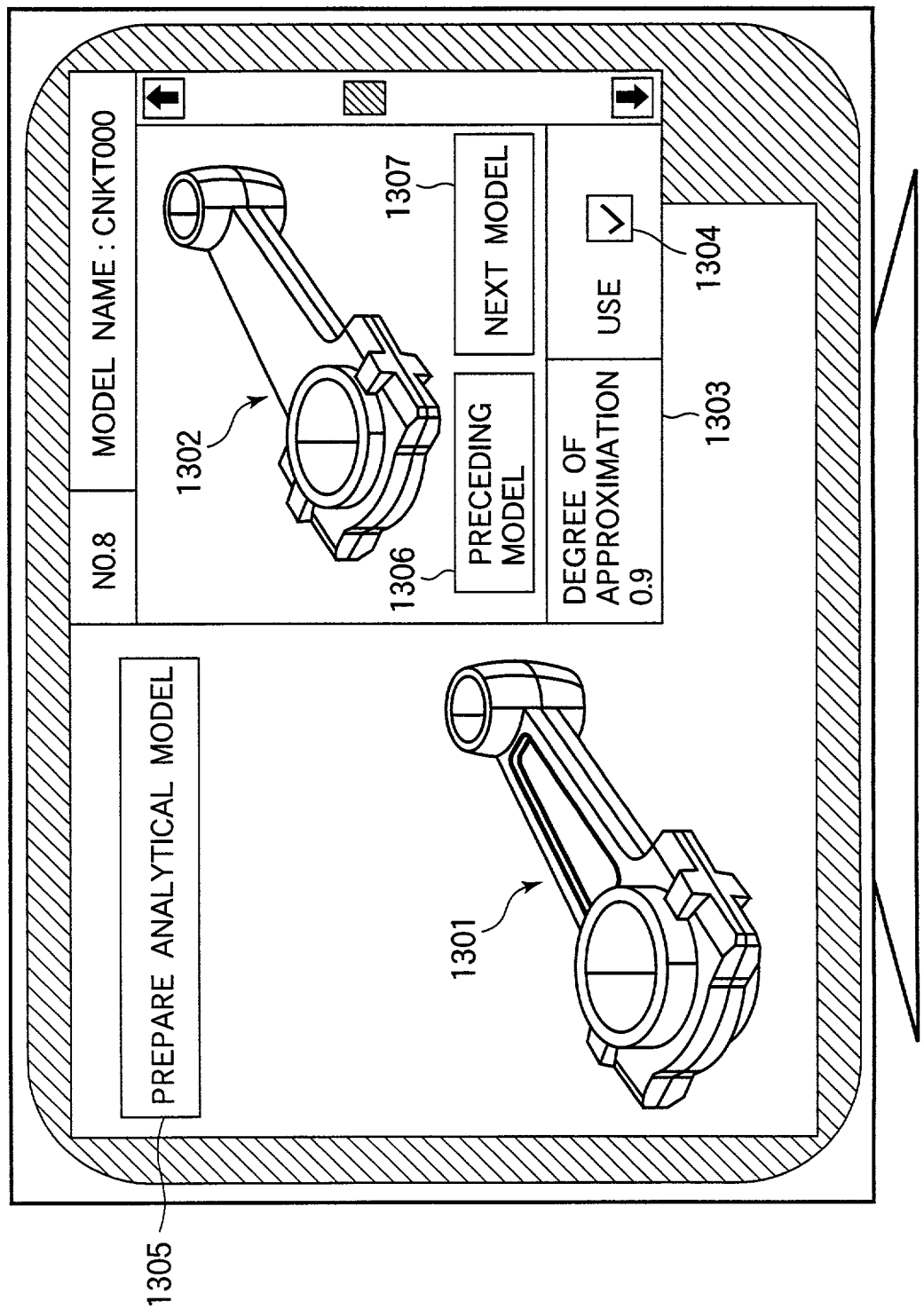
FIG. 13 illustrates a typical display screen in a case where degree of approximation means 103 calculates a degree of approximation between a shape model to be analyzed and shape models registered on individual templates.

FIG. 13 illustrates a typical display screen in a case where the degree of approximation between a shape model to be analyzed and shape models registered in individual templates is calculated.

The degree of approximation calculating means 103 calculates a degree of approximation between the shape model to be analyzed and shape models registered in the individual templates. The degree of approximation is a numerical value representing the extent of applicability of the individual templates upon preparing the analytical model of the shape model to be analyzed, and can be expressed by a ratio of association of the shape element composing the shape model to be analyzed with the shape elements registered in the templates.

Formula (2):

$$\text{Degree of approximation} = \frac{\text{Number of shape elements associated with template}}{\text{Number of shape elements composing shape model to be analyzed}}$$

A degree of approximation is a real number within a range of from 0 to 1. A template of a larger degree of approximation is more effective for preparing an analytical model of a shape model to be analyzed.

The method for associating the shape model to be analyzed with the shape element of a shape model registered in the template will now be described. Association is executed by any of the following three methods, and the maximum value of the results is used as the degree of approximation for the template.

Method 1: When the template is equal to the model name of the shape model to be analyzed, the shape elements are associated by means of an intrinsic identifier of the shape elements. More specifically, from among the shape models to be analyzed and the shape models of template, shape elements having the same identifier are associated with each other. When preparing a new shape model by parametrically changing the shape model size. Method 1 uses the feature that the identifier of the shape element is uniform between before and after the change.

Method 2: Shape elements are associated by use of topological information of the template and the shape model to be analyzed. When the both shape models have the same topology, shape elements topologically corresponding to each other are associated.

Method 3: Shape elements are associated with each other by means of coordinate values of the template and the shape model to be analyzed. In the both models, apices having the same coordinate values, ridges having starting and end points of the same coordinate values, and surfaces having all the apices composing the surfaces of the same coordinate values are associated with each other.

When values of model classification are entered by the model input means, only templates having the same model classification are subjected to calculation of the degree of approximation. When no model classification is entered, calculation is executed for all the templates. By previously entering the model classification by the model input means, it is possible to estimate templates having higher similarities from the model classification, thus limiting templates for which the degree of approximation is to be calculated, thus permitting efficient execution of calculation.

When the user has selected the PREVIEW button through the model input means, for example as shown in FIG. 13, the degree of approximation calculating means displays, after the completion of calculation of the degree of approximation, the template 1302 and the degree of approximation 1303, together with the shape model to be analyzed 1301, sequentially from larger to smaller degrees of approximation on the display screen 100a. By displaying shape elements associated in the both shape models, or by highlighting the shape elements not associated, it is easier for the user to grasp the result of degree of approximation calculation.

FIG. 13 illustrates a typical display of a shape element not associated in the shape model to be analyzed 1301 with a thick line. When using the displayed template for preparing an analytical model, the user checks the use button 1304 by means of the input unit. When not using the template, a state without checking is achieved. By selecting the preceding model button 1306 and the next model button 1307 in this screen, a higher degree of approximation model and a lower degree of approximation model of the analytical model displayed on the screen are displayed on the screen. When selecting the analytical model preparing button 1305, the process advances to the analytical model preparation which is the next step.

2.4 Analytical Model Preparing Means 104

The analytical model preparing means 104 prepares an analytical model corresponding to a shape model to be analyzed by the full use of the mesh preparing conditions and analyzing conditions from among those of the analytical models registered in the template. When PREVIEW is selected by the model input means 102, analytical models of the shape models to be analyzed are prepared by use of only templates checked by the degree of approximation calculating means. When EXECUTE is selected, analytical models of the shape models to be analyzed are prepared by use of only templates having a degree of approximation over a degree of approximation threshold value. More specifically, the analytical model preparing means 104 prepares an analytical model of the same kind as the number of used templates for a shape model to be analyzed.

Figure 14:
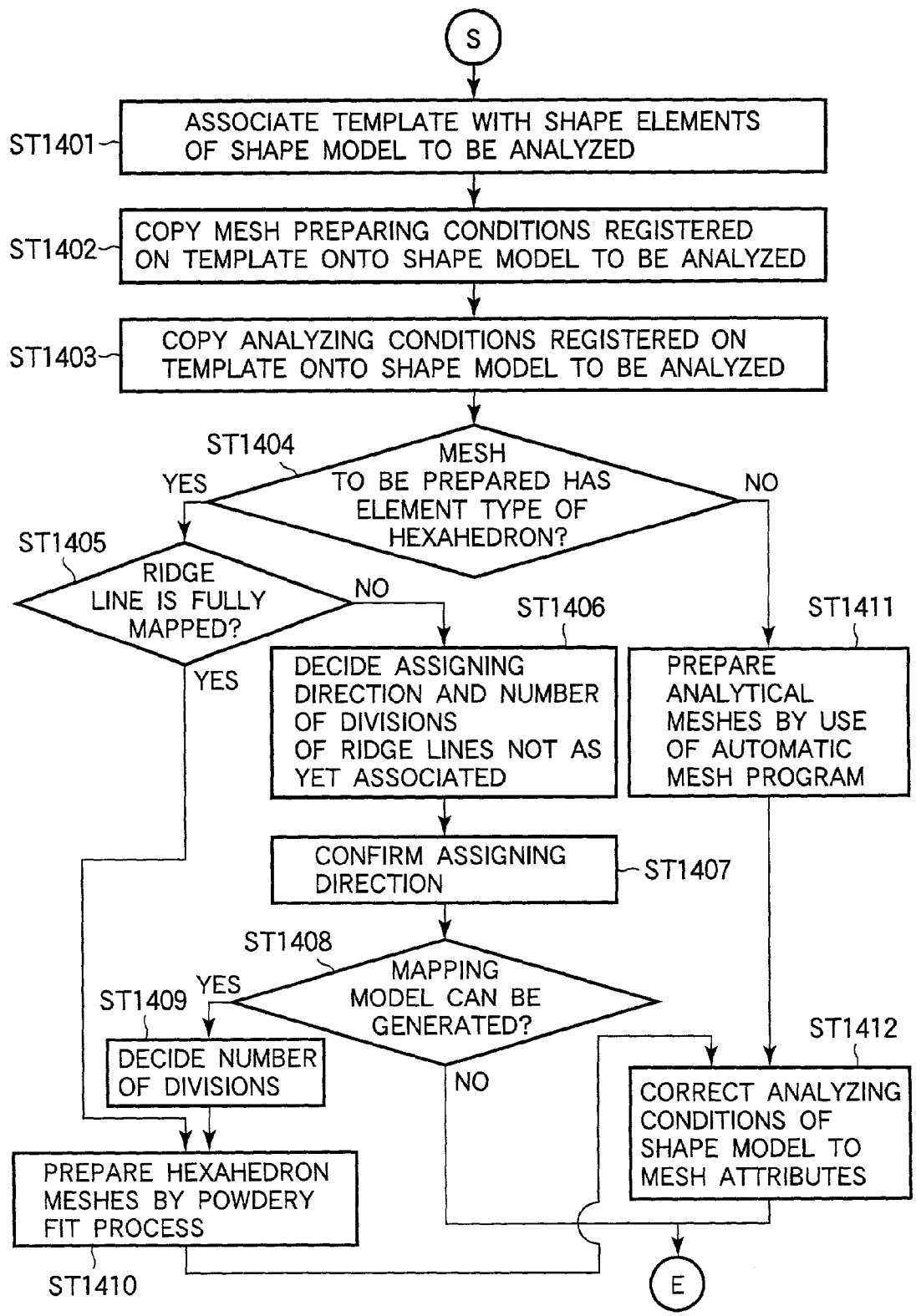
FIG. 14 is a flow-chart illustrating a processing procedure for preparing an analytical model of the analytical model preparing means 104.

FIG. 14 is a flow-chart illustrating the processing procedure for preparation of an analytical model of the analytical model preparing means 104.

Step 1401: A shape model registered in a template is associated with a shape elements composing a shape model to be analyzed. Association of shape elements is in the same manner as in processing by the degree of approximation calculating means.

Step 1402: For those associated with shape elements of the template shape models from among shape elements of the shape models to be analyzed, the mesh preparing conditions registered in templates are copied onto the shape models to be analyzed. For example, when the ridge of ridge No. 1 of a shape model to be analyzed is associated with the ridge of ridge No. 3 of the template, and a number of divisions of 7 and an assigning direction of +y are registered as attributes of that ridge of the template, a number of divisions of 7 and an assigning direction of +y are registered as attributes of the ridge of ridge No. 1 composing the shape model to be analyzed.

Step 1403: The analyzing conditions are copied in the same manner as in the mesh preparing conditions.

Step 1404: The element type of the mesh to be prepared is checked. While meshes can be automatically prepared almost for any shape model for a tetrahedron or a rectangular mesh, it is not possible to automatically prepare a mesh for some shapes to be analyzed for a hexahedron mesh.

Step 1405: When the element type to be prepared is a hexahedron, it is determined whether or not all the ridges of the shape models to be analyzed have been associated with the shape elements of the template. When all the ridges have been associated, the mapped model of the shape model to be analyzed has the same shape as the template model. Hexahedron meshes are therefore generated by use of the template model.

Step 1406: When there are ridges not associated, an assigning direction is decided from the coordinate values of the starting and end points of the ridge. Components x, y and z of the vector directed from the starting point toward the end point are determined, and the axial direction having the largest absolute-value is adopted as the assigning axial direction of the ridge, thus confirming positive or negative of the vector component in the assigning axial direction. If the component is positive, the positive direction of the assigning axial direction is used as the assigning direction of that ridge. When the component is negative, the negative direction of the assigning axial direction is adopted as the assigning direction. For example, when the vector directed from the starting point toward the end point is expressed by (x, y, z)=(0.2, −0.8, 0.2), the assigning axial direction is y-direction, and since the y-direction component is negative, the assigning direction would be −y.

Step 1407: The assigning direction is confirmed, and the allowability of preparation of a mapping model is determined. It is determined whether or not a combination of ridge arranging directions satisfies the following rules for the validity of a mapping model:

[Condition 1] The starting and end points agree with each other by following the arranging direction of the ridges composing a loop; and

[Condition 2] Any two adjacent ridges within a loop are not in the directions counter to each other along the axis.

Figure 15:
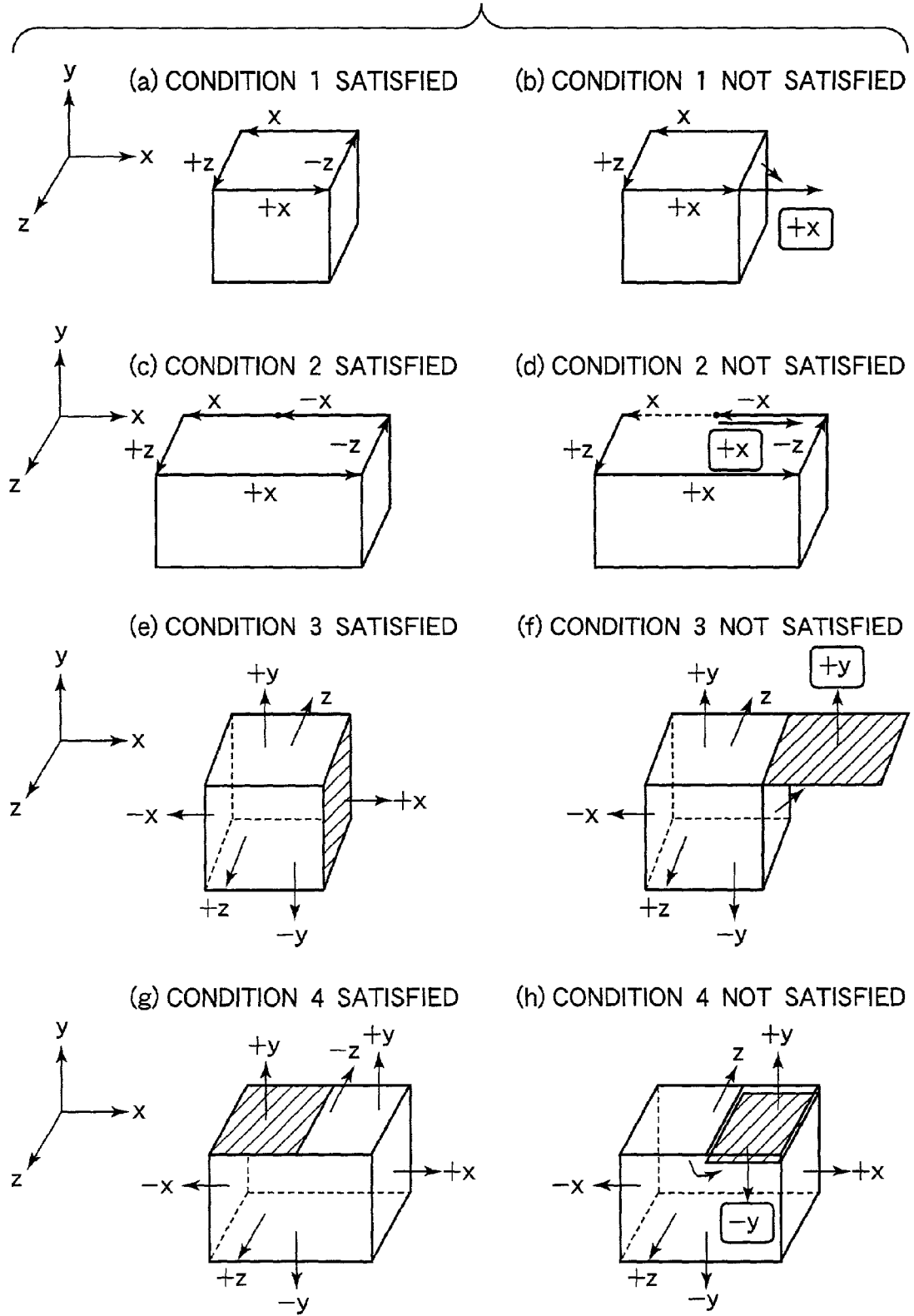
FIG. 15 illustrates a case of confirmation of the assigning direction and propriety of preparation of a mapping model.

FIG. 15 illustrates a case of confirmation of the assigning direction and propriety of preparation of a mapping model.

Cases of satisfaction and non-satisfaction of conditions 1 and 2 are shown in FIGS. 15A and 15D.

When the rules are satisfied, the arranging direction of surface is decided on the basis of the arranging direction of the ridge. The arranging direction is given by the direction of an outer product of two ridges composing a loop. After deciding the arranging directions of all the surfaces, it is determined whether or not the combination of arranging directions of the surfaces satisfy the following rules for validation of a mapping model:

[Condition 3] There exists at least one surface arranged in each of three coordinate axial positive and negative directions within a solid; and

[Condition 4] Any two adjacent surfaces within the solid are not in the directions counter to each other along the axis.

Cases of satisfaction and non-satisfaction of conditions 3 and 4 are shown in FIGS. 15E to 15H.

Step 1408: When a mapping model can be prepared, the process advances to step 1409. If preparation is not allowable, the processing comes to an end. Although the processing comes to an end if preparation of a mapping model is not allowable, the assigning direction may be corrected by use of a membership function and the assigning direction may be repeatedly checked, as disclosed in Japanese Unexamined Patent Application Publication No. 1-311373.

Step 1409: When it is allowed to prepare a mapping model, a number of divisions is decided so as to keep connection between ridges of the shape to complete the mapping model.

Step 1410: According to the mesh generating method based on the mapping process, lattice points of the mapping model are mapped onto the shape model by the boundary-fit process to prepare hexahedron meshes.

Step 1411: Analytical meshes are prepared in accordance with an automatic mesh preparing program in response to the element to be prepared such as a tetrahedron or a rectangle.

Step 1412: The analyzing conditions set for the shape model to be analyzed are converted into attributes of the analytical meshes.

According to the aforementioned procedure, the mesh preparing information and the analytical model information registered in the template are taken over regarding the shape elements associated with the template shape model in the shape model to be analyzed. It is therefore possible to automatically generate meshes of a quality close to that of the template and an analytical model having analyzing conditions close to that of the template.

2.5 Analytical Model Correcting Means 105

FIG. 16 illustrates a typical output screen of the analytical model correcting means 105. The template 1602 and the analytical model 1601 prepared by means of the template are displayed on the screen to urge the user to correct the analytical model.

As required, the user can add or delete mesh preparing conditions or analyzing conditions by specifying the shape elements of the analytical model 1601 with a pointer 1605 of the mouse 100*c*, after selecting a mesh preparing condition changing button 1603 or an analyzing condition changing button 1604.

When the assigning direction of the ridge is changed upon changing the mesh preparing conditions, step 1407 and the subsequent steps described above are executed by means of the analytical model preparing means 104. When it is allowed to generate a mapping model, the mapping model is completed, and hexahedron meshes are generated.

When any other mesh preparing condition is changed, step 1410 or step 1411 and the subsequent steps are executed in response to the type of element to be prepared to prepare meshes again.

When an analyzing condition is changed, step 1412 is executed again.

If the preceding model button 1607 or the next model button 1608 is selected on the screen shown in FIG. 16, a model of a higher degree of approximation and a model of a lower degree of approximation of the analytical model displayed on the screen are displayed on the screen.

When selecting the mesh quality evaluation button 1606, correction of the analytical model is completed, and the process goes to mesh quality evaluation which is the next step.

2.6 Mesh Quality Evaluating Means 106

The mesh quality evaluating means 106 evaluates the quality of meshes registered for a plurality of analytical models prepared by the analytical model preparing means 105. The mesh quality evaluating method will now be described.

The mesh quality evaluating means 106 selects at least one evaluation parameter from among at least one mesh quality evaluation parameter registered in the evaluation parameter database 107 on the basis of the area of model and the area of analysis entered by the model input means 102, and calculates mesh quality of the analytical model.

Check items of mesh quality include, for example, distortion value, stretch value, element side angle, and element surface warp. The distortion value is a numerical value within a range of from 0.0 to 1.0 for evaluating distortion of the element: a larger value suggests an element of a smaller shape distortion. The stretch value is a numerical value within a range of from 0.0 to 1.0 for evaluating a stretch of the element: a larger value corresponds to an element of a smaller stretch. The element side angle is a maximum value of angle between element sides composing the element: a smaller value corresponds to an element of a smaller distortion. The element surface warp is the maximum value of angle between normal vectors in two triangles for each element surface of element: a smaller value corresponds to an element of a smaller distortion.

Mesh quality evaluation is conducted by setting a threshold value for each of the above-mentioned check items, and determining the ratio of the number of elements having a quality superior to the threshold value to the total number of elements: a higher mesh quality corresponds to a higher evaluation value. The evaluation formula can be defined by the following formula (3) by assuming a mesh quality evaluation value W, a number N of elements composing the analytical mesh, a distortion value dsi(i) of the element number i, a stretch value str(i), an element side angle ang(i), an element surface warp wrp(i), a threshold value Dth of the distortion value, a threshold value Sth of the stretch value, a threshold value Ath of the element side angle, a threshold value Wth of the element surface warp, and a function f(x) of 1 when x is true and 0 when x is false:

Formula (3):

$$W = \sum_{i=1}^{} f(dis(i) \geq Dth) \times$$

$$f(str(i) \geq Sth) \times f(ang(i) \leq Ath) \times f(wrp(i) \leq Wth)/N$$

FIG. 17 illustrates a typical data structure of the evaluation parameter database 107. The mesh quality an analytical model is required to have differs depending upon the area of analysis and the model to be analyzed. The evaluation parameter database 107 has therefore a data structure, as shown in FIG. 17, in which threshold values for the check items are registered in response to the area of analysis and the model classification. The term NO_USE attached to items in FIG. 17 means that those items are not checked, and excluded from the items of the above-mentioned evaluation formula.

When the evaluation parameter database 107 contains no condition in agreement for both the model classification and the area of analysis, a condition under which the area of analysis is in agreement and of which a default is set for the model classification is selected, and a message "No condition under which the model classification is in agreement; default is used" is displayed.

When a condition is not selected through the two above-mentioned steps, the conditions having defaults are selected for both the area of analysis and the model classification, and a message "No condition under which the area of analysis and the model classification are in agreement; default values are used" is displayed.

When the evaluation parameters are displayed on the screen in a table format shown in FIG. 17, the user can change, add or delete evaluation parameters.

The ratio of the number of elements for which the threshold values are exceeded to the total number of elements is used as the mesh evaluation value in the example described above. The number of elements for which values of parameters are under the threshold values may be used as the mesh evaluation value. In this case, a smaller evaluation value corresponds to a higher quality of mesh.

When elements having parameters lower than the threshold values are in contact with each other on surfaces, these elements may be treated as a group, and the number of elements lower in quality than the threshold values may be adopted as the mesh evaluation value. In this case also, a smaller evaluation value corresponds to a mesh of a higher quality. By displaying the elements in different colors on the screen by element group, it is easier for the user to discriminate a portion of a lower element quality.

Figure 18:
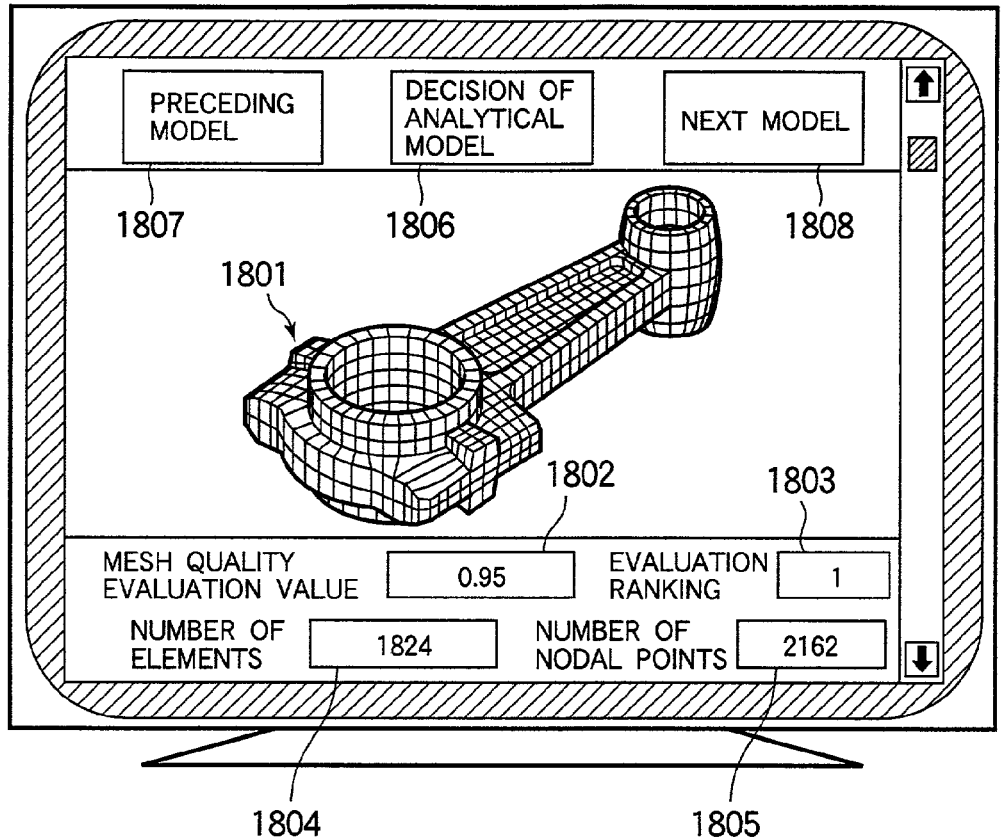
FIG. 18 illustrates a typical display screen of the result of mesh quality evaluation of the mesh quality evaluating means 106.

FIG. 18 illustrates a typical display screen of the result of mesh quality evaluation of the mesh quality. Upon the completion of the evaluating calculation of mesh quality, the mesh quality evaluating means displays the analytical models 1801, a mesh quality evaluation value 1802, an evaluation ranking 1803, the number of elements 1804, and the number of nodal points 1805 on the display screen 100*a*. The analytical models are displayed in a sequence of higher to lower mesh quality evaluation values. For equal mesh evaluation values, the analytical models are displayed in a sequence from a smaller number of nodal points, thus permitting efficient selection of an appropriate analytical model.

When the user selects an analytical model deciding button 1806 in this screen, the analytical models displayed on the screen are output into a file, and the analytical model information entered from the model input means 102 is associated with the shape models to be analyzed and the analytical models, and the result is registered into the template database 101.

When the preceding model button 1807 and the next model button 1808 are selected, models having higher and lower evaluation values than the analytical model displayed on the screen are also displayed on the screen.

3. Examples of Analytical Model Preparation by Analytical Model Preparing Apparatus of the Invention Examples of analytical model preparation by the analytical model preparing apparatus of the invention will now be described.

Figure 19:
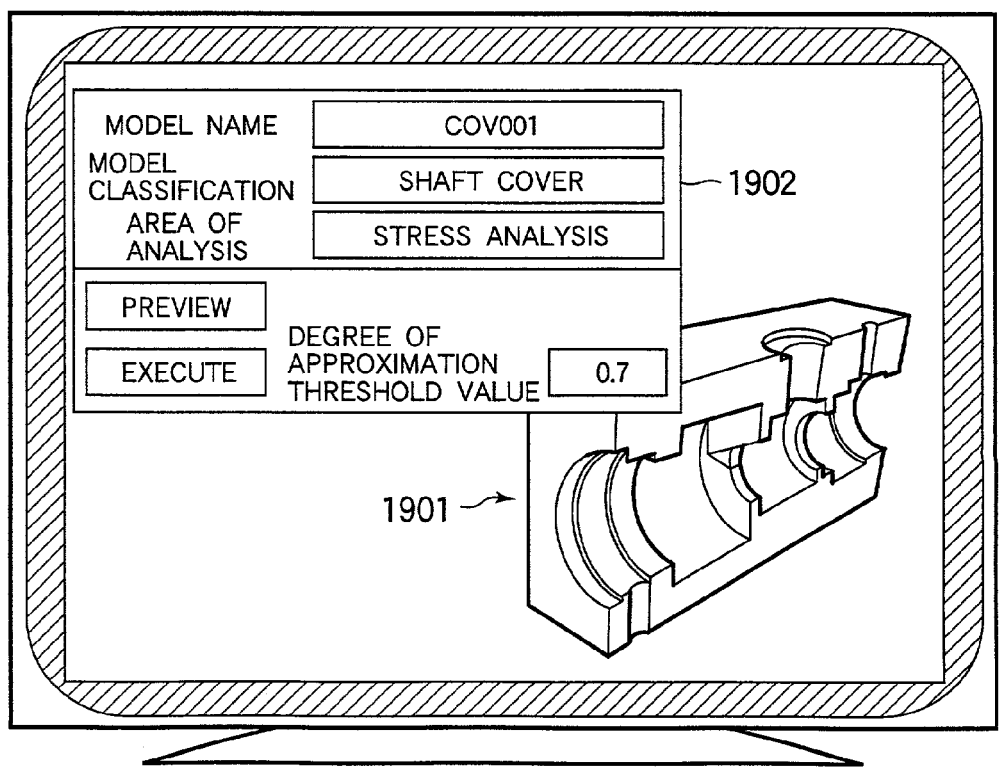
FIG. 19 illustrates a typical screen for entering analytical model information of the shape model to be analyzed.

FIG. 19 illustrate a typical screen for entering analytical model information of the shape model to be analyzed. In this case, meshes of a shaft cover model 1901 shown in FIG. 19 is prepared.

First, the user enters analytical model information of the shape model to be analyzed into the analytical model information input window 1902 shown in FIG. 19. This mode has a name COV001, a model classification of a shaft cover, and an area of analysis of stress analysis.

Then, the user selects the PREVIEW button to start preparation of an analytical model. In response thereto, the analytical model preparing apparatus calculates a degree of approximation of the shape model to be analyzed with the template registered in the template database.

FIG. 20 illustrates typical contents of registration of the template database. In FIG. 20, illustration of mesh preparing conditions and analyzing conditions other than the element type is omitted. For example, four models are registered in the template database.

Because the model classification for the shape model to be analyzed is the shaft cover, a degree of approximation is calculated only for Nos. 2 and 3 templates having the model classification of shaft cover from among the templates registered in the template database.

The entered shape models to be analyzed 1901 are shape models of Nos. 2 and 3 of the template database prepared by parametrically changing the bore diameter in the depth direction. Since the both models have the same model name as that of the shape model to be analyzed, the shape elements are associated by use of an intrinsic identifier of the shape elements.

As a result of association, the both templates have a decree of approximation of 1.0. Upon the completion of the calculation of the degree of approximation, the result is displayed for the user in a screen format as shown in FIG. 13. The user confirms the shape of the template selected on the screen, determines whether or not to use as a template, and gives a check on the screen. Because both Nos. 2 and 3 templates are to be used, the user gives a check mark to the both templates, and then selects the analytical model preparing button.

In response to this, the analytical model preparing apparatus prepares an analytical model in accordance with the flowchart shown in FIG. 14 by use of the template models. In the both templates, the element type is a hexahedron, and all ridges are associated. Hexahedron meshes are therefore automatically generated.

Then, the analytical model preparing apparatus evaluates the quality of meshes of the prepared analytical models. By retrieving the evaluation parameter database shown in FIG. 17 with area of analysis=stress analysis and model classification=shaft cover, the following values of parameters for mesh quality evaluation can be determined: a distortion threshold value of 0.3, an element side angle threshold value of 150.0, and other check item not used.

Evaluation of the mesh quality by means of these parameters leads to an evaluation value of 1.00 for the analytical model prepared on the basis of template No. 2, and an evaluation value of 0.99 for the analytical model prepared on the basis of template No. 3.

Finally, the analytical model preparing apparatus displays the prepared analytical models in the sequence of evaluation value on the screen, and urges the user to select an analytical model.

Figure 21:
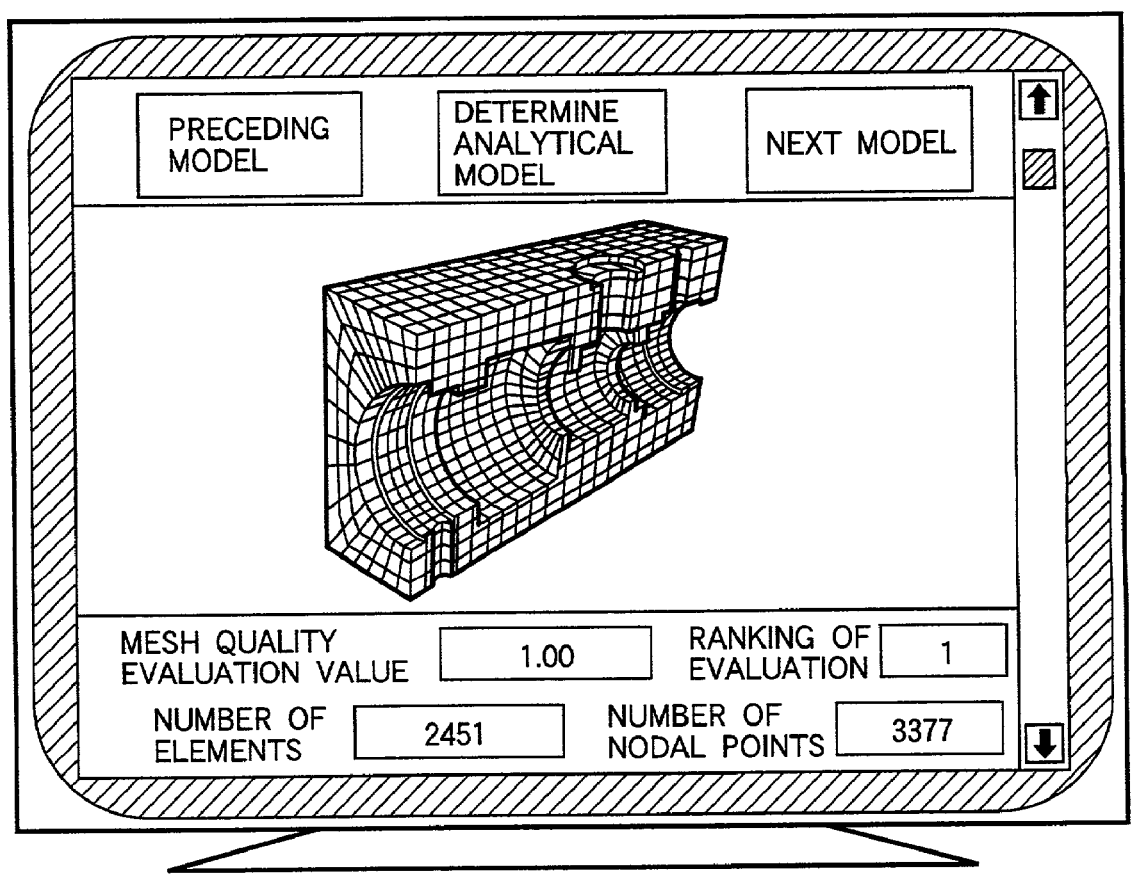
FIG. 21 illustrates an initial state of the mesh quality display screen presented to the user.

FIG. 21 illustrates an initial state of the mesh quality display screen presented to the user. Information including the analytical model prepared on the basis of template No. 2 having a higher evaluation value, the evaluation value, the number of elements, and the number of nodal points is displayed. The user may select the analytical model having the highest evaluation value displayed in the initial state, or may select the next model button, and after confirming other analytical models, select an analytical model.

A case where the PREVIEW button is selected and preparation of analytical models is started has been described above. By selecting the EXECUTE button, it is possible to omit the template selecting operation after calculation of the degree of approximation, and obtain a similar analytical model.

As described above, an analytical model for executing an accurate analysis can be efficiently prepared by preparing analytical models on the basis of a plurality of templates registered in the template database, evaluating the mesh quality of the prepared analytical models, outputting the analytical models and the mesh quality evaluation values on the screen, and causing the user to select an analytical model to be used.

According to the present invention, an appropriate template is selected from among a plurality of templates registered in the database for an entered shape model to be analyzed and presented to the user. It is therefore possible to save labor of the template selecting operation.

Since an appropriate template is provided, it is possible to efficiently prepare meshes accurately analyzable, and reduce the labor for setting analyzing conditions.

What is claimed is:

1. An analytical model producing apparatus comprising:
   means for entering a shape model to be analyzed;
   a database which maps each of a plurality of shape models previously made together with analytical hexahedron mesh models corresponding to the shape models previously made;
   a degree of approximation calculating means including:
     means for producing associated information of shape elements by comparing shape elements in the shape model to be analyzed with shape elements in the shape models previously made and associating the shape elements in the shape model to be analyzed with the shape elements in the shape models previously made,
     means for calculating a degree of approximation of the shape elements of the shape models previously made based on the number of shape elements of the shape model to be analyzed and the number of shape elements of the shape model previously made associated with the associated information of the shape elements,
     means for displaying sequentially the shape models previously made from larger to smaller degrees of approximation on a display screen, and
     means for selecting, in response to an instruction, at least one of the shape models previously made from among said shape models previously made displayed; and
   an analytical model producing means for producing an analytical hexahedron mesh model of the shape model to be analyzed which has a number of divisions of a ridge and a direction of ridge arrangement corresponding to the number of divisions of the ridge and the direction of ridge arrangement of said shape model previously made selected by the means for selecting, in accordance with the associated information of the shape elements between the shape elements in the shape model to be analyzed and the shape elements in the shape models previously made.

2. An analytical model producing apparatus according to claim 1, wherein said degree of approximation calculating means includes means for comparing an intrinsic identifier of the shape element in the shape model to be analyzed with intrinsic identifiers of the shape elements in the shape models previously made, and associating the shape elements having the same identifier with each other.

3. An analytical model producing apparatus according to claim 1, wherein said degree of approximation calculating means includes means for comparing topological information of the shape element in the shape model to be analyzed with topological information of the shape elements in the shape models previously made, and associating the shape elements having the same topology with each other.

4. An analytical model producing apparatus according to claim 1, wherein said degree of approximation calculating means includes means for comparing coordinate values of the shape element in the shape model to be analyzed with coordinate values of the shape elements in the shape models previously made, and associating the shape elements having the same coordinate values with each other.

* * * * *